United States Patent
Morris et al.

(10) Patent No.: US 9,613,831 B2
(45) Date of Patent: Apr. 4, 2017

(54) ENCAPSULATED DIES WITH ENHANCED THERMAL PERFORMANCE

(71) Applicant: RF Micro Devices, Inc., Greensboro, NC (US)

(72) Inventors: Thomas Scott Morris, Lewisville, NC (US); David Jandzinski, Summerfield, NC (US); Stephen Parker, Burlington, NC (US); Jon Chadwick, Greensboro, NC (US); Julio C. Costa, Oak Ridge, NC (US)

(73) Assignee: Qorvo US, Inc., Greensboro, NC (US)

( * ) Notice: Subject to any disclaimer, the term of this patent is extended or adjusted under 35 U.S.C. 154(b) by 0 days.

(21) Appl. No.: 14/959,129

(22) Filed: Dec. 4, 2015

(65) Prior Publication Data
US 2016/0284568 A1    Sep. 29, 2016

Related U.S. Application Data

(60) Provisional application No. 62/138,177, filed on Mar. 25, 2015.

(51) Int. Cl.
*H01L 21/50* (2006.01)
*H01L 21/56* (2006.01)
(Continued)

(52) U.S. Cl.
CPC .......... *H01L 21/563* (2013.01); *H01L 21/561* (2013.01); *H01L 21/568* (2013.01);
(Continued)

(58) Field of Classification Search
CPC . H01L 21/568; H01L 23/3135; H01L 21/563; H01L 25/0655; H01L 2224/10; H01L 23/373
(Continued)

(56) References Cited

U.S. PATENT DOCUMENTS 4,093,562 A    6/1978  Kishimoto
4,366,202 A   12/1982  Borovsky
(Continued)

FOREIGN PATENT DOCUMENTS

CN    103811474 A    5/2014
JP    2006005025 A   1/2006
(Continued)

OTHER PUBLICATIONS

Applicant-Initiated Interview Summary for U.S. Appl. No. 13/852,648, mailed Jan. 27, 2014, 4 pages.
(Continued)

*Primary Examiner* — Luan C Thai
(74) *Attorney, Agent, or Firm* — Withrow & Terranova, P.L.L.C.

(57) ABSTRACT

The present disclosure relates to enhancing the thermal performance of encapsulated flip chip dies. According to an exemplary process, a plurality of flip chip dies are attached on a top surface of a carrier, and a first mold compound is applied over the top surface of the carrier to encapsulate the plurality of flip chip dies. The first mold compound is thinned down to expose a substrate of each flip chip die and the substrate of each flip chip die is then substantially etched away to provide an etched flip chip die that has an exposed surface at the bottom of a cavity. Next, a second mold compound with high thermal conductivity is applied to substantially fill each cavity and the top surface of the second mold compound is planarized. Finally, the encapsulated etched flip chip dies can be marked, singulated, and tested as a module.

27 Claims, 6 Drawing Sheets

(51) Int. Cl.
  *H01L 25/065* (2006.01)
  *H01L 23/31* (2006.01)
  *H01L 23/29* (2006.01)
  *H01L 23/373* (2006.01)

(52) U.S. Cl.
  CPC .......... *H01L 23/29* (2013.01); *H01L 23/3135* (2013.01); *H01L 23/373* (2013.01); *H01L 25/0655* (2013.01); *H01L 2224/10* (2013.01); *H01L 2224/81* (2013.01)

(58) Field of Classification Search
  USPC ........................................................ 438/122
  See application file for complete search history.

(56) References Cited

U.S. PATENT DOCUMENTS

| | | | |
|---|---|---|---|
| 5,061,663 A | 10/1991 | Bolt et al. | |
| 5,069,626 A | 12/1991 | Patterson et al. | |
| 5,391,257 A | 2/1995 | Sullivan et al. | |
| 5,459,368 A | 10/1995 | Onishi et al. | |
| 5,646,432 A | 7/1997 | Iwaki et al. | |
| 5,699,027 A | 12/1997 | Tsuji et al. | |
| 5,709,960 A | 1/1998 | Mays et al. | |
| 5,831,369 A | 11/1998 | Fürbacher et al. | |
| 5,920,142 A | 7/1999 | Onishi et al. | |
| 6,072,557 A | 6/2000 | Kishimoto | |
| 6,235,554 B1* | 5/2001 | Akram ................. | H01L 23/13 257/E23.004 |
| 6,236,061 B1 | 5/2001 | Walpita | |
| 6,426,559 B1 | 7/2002 | Bryan et al. | |
| 6,446,316 B1 | 9/2002 | Fürbacher et al. | |
| 6,578,458 B1 | 6/2003 | Akram et al. | |
| 6,649,012 B2 | 11/2003 | Masayuki et al. | |
| 6,943,429 B1 | 9/2005 | Glenn et al. | |
| 6,992,400 B2* | 1/2006 | Tikka ................. | H01L 23/3135 257/787 |
| 7,042,072 B1 | 5/2006 | Kim et al. | |
| 7,109,635 B1 | 9/2006 | McClure et al. | |
| 7,288,435 B2 | 10/2007 | Aigner et al. | |
| 7,307,003 B2 | 12/2007 | Reif et al. | |
| 7,393,770 B2 | 7/2008 | Wood et al. | |
| 7,427,824 B2 | 9/2008 | Iwamoto et al. | |
| 7,596,849 B1 | 10/2009 | Carpenter et al. | |
| 7,635,636 B2 | 12/2009 | McClure et al. | |
| 7,714,535 B2 | 5/2010 | Yamazaki et al. | |
| 7,855,101 B2 | 12/2010 | Furman et al. | |
| 7,868,419 B1 | 1/2011 | Kerr et al. | |
| 7,960,218 B2 | 6/2011 | Ma et al. | |
| 8,183,151 B2 | 5/2012 | Lake | |
| 8,503,186 B2 | 8/2013 | Lin et al. | |
| 8,643,148 B2* | 2/2014 | Lin ................. | H01L 23/49827 257/620 |
| 8,772,853 B2 | 7/2014 | Hong et al. | |
| 8,816,407 B2 | 8/2014 | Kim et al. | |
| 8,835,978 B2* | 9/2014 | Mauder ................. | H01L 27/12 257/140 |
| 8,921,990 B2* | 12/2014 | Park ................. | H01L 23/367 257/680 |
| 8,927,968 B2 | 1/2015 | Cohen et al. | |
| 2001/0004131 A1 | 6/2001 | Masayuki et al. | |
| 2004/0166642 A1 | 8/2004 | Chen et al. | |
| 2004/0219765 A1 | 11/2004 | Reif et al. | |
| 2005/0037595 A1 | 2/2005 | Nakahata | |
| 2005/0079686 A1 | 4/2005 | Aigner et al. | |
| 2005/0212419 A1 | 9/2005 | Vazan et al. | |
| 2006/0108585 A1 | 5/2006 | Gan et al. | |
| 2006/0261446 A1 | 11/2006 | Wood et al. | |
| 2007/0020807 A1 | 1/2007 | Geefay et al. | |
| 2007/0069393 A1 | 3/2007 | Asahi et al. | |
| 2007/0190747 A1 | 8/2007 | Humpston et al. | |
| 2007/0252481 A1 | 11/2007 | Iwamoto et al. | |
| 2007/0276092 A1 | 11/2007 | Kanae et al. | |
| 2008/0050852 A1 | 2/2008 | Hwang et al. | |
| 2008/0272497 A1 | 11/2008 | Lake | |
| 2008/0315372 A1 | 12/2008 | Kuan et al. | |
| 2009/0014856 A1 | 1/2009 | Knickerbocker et al. | |
| 2010/0012354 A1 | 1/2010 | Hedin et al. | |
| 2010/0045145 A1 | 2/2010 | Tsuda | |
| 2010/0081232 A1 | 4/2010 | Furman et al. | |
| 2010/0081237 A1 | 4/2010 | Wong et al. | |
| 2010/0173436 A1 | 7/2010 | Ouellet et al. | |
| 2011/0026232 A1 | 2/2011 | Lin et al. | |
| 2011/0036400 A1 | 2/2011 | Murphy et al. | |
| 2011/0068433 A1 | 3/2011 | Kim et al. | |
| 2011/0102002 A1 | 5/2011 | Riehl et al. | |
| 2012/0068276 A1 | 3/2012 | Lin et al. | |
| 2012/0094418 A1 | 4/2012 | Grama et al. | |
| 2013/0015429 A1 | 1/2013 | Hong et al. | |
| 2013/0299871 A1 | 11/2013 | Mauder et al. | |
| 2014/0168014 A1 | 6/2014 | Chih et al. | |
| 2014/0252566 A1 | 9/2014 | Kerr et al. | |
| 2014/0252567 A1 | 9/2014 | Carroll et al. | |
| 2014/0264818 A1 | 9/2014 | Lowe, Jr. et al. | |
| 2014/0306324 A1 | 10/2014 | Costa et al. | |
| 2014/0327150 A1 | 11/2014 | Jung et al. | |
| 2015/0115416 A1 | 4/2015 | Costa et al. | |
| 2015/0235990 A1 | 8/2015 | Cheng et al. | |
| 2015/0235993 A1 | 8/2015 | Cheng et al. | |
| 2015/0255368 A1 | 9/2015 | Costa | |
| 2015/0364344 A1 | 12/2015 | Yu et al. | |

FOREIGN PATENT DOCUMENTS

| | | |
|---|---|---|
| JP | 2007227439 A | 9/2007 |
| JP | 2008235490 A | 10/2008 |
| JP | 2008279567 A | 11/2008 |
| JP | 2009026880 A | 2/2009 |
| JP | 2009530823 A | 8/2009 |
| WO | 2007074651 A1 | 7/2007 |

OTHER PUBLICATIONS

Advisory Action for U.S. Appl. No. 13/852,648, mailed Mar. 7, 2014, 4 pages.
Notice of Allowance for U.S. Appl. No. 13/852,648, mailed Jun. 16, 2014, 9 pages.
Notice of Allowance for U.S. Appl. No. 13/852,648, mailed Sep. 26, 2014, 8 pages.
Notice of Allowance for U.S. Appl. No. 13/852,648, mailed Jan. 22, 2015, 8 pages.
Non-Final Office Action for U.S. Appl. No. 13/852,648, mailed Jun. 24, 2015, 20 pages.
Final Office Action for U.S. Appl. No. 13/852,648, mailed Oct. 22, 2015, 20 pages.
Non-Final Office Action for U.S. Appl. No. 13/852,648, mailed Feb. 19, 2016, 12 pages.
Non-Final Office Action for U.S. Appl. No. 14/315,765, mailed Jan. 2, 2015, 6 pages.
Final Office Action for U.S. Appl. No. 14/315,765, mailed May 11, 2015, 17 pages.
Advisory Action for U.S. Appl. No. 14/315,765, mailed Jul. 22, 2015, 3 pages.
Non-Final Office Action for U.S. Appl. No. 14/260,909, mailed Mar. 20, 2015, 20 pages.
Final Office Action for U.S. Appl. No. 14/260,909, mailed Aug. 12, 2015, 18 pages.
Non-Final Office Action for U.S. Appl. No. 14/261,029, mailed Dec. 5, 2014, 15 pages.
Notice of Allowance for U.S. Appl. No. 14/261,029, mailed Apr. 27, 2015, 10 pages.
Corrected Notice of Allowability for U.S. Appl. No. 14/261,029, mailed Nov. 17, 2015, 5 pages.
Non-Final Office Action for U.S. Appl. No. 14/529,870, mailed Feb. 12, 2016, 14 pages.
Non-Final Office Action for U.S. Appl. No. 14/715,830, mailed Apr. 13, 2016, 16 pages.
Extended European Search Report for European Patent Application No. 15184861.1, mailed Jan. 25, 2016, 6 pages.

(56) References Cited

OTHER PUBLICATIONS

Non-Final Office Action for U.S. Appl. No. 12/906,689, mailed May 27, 2011, 13 pages.
Non-Final Office Action for U.S. Appl. No. 12/906,689, mailed Nov. 4, 2011, 20 pages.
Search Report for Japanese Patent Application No. 2011-229152, created on Feb. 22, 2013, 58 pages.
Office Action for Japanese Patent Application No. 2011-229152, drafted May 10, 2013, 7 pages.
Final Rejection for Japanese Patent Application No. 2011-229152, drafted Oct. 25, 2013, 2 pages.
Final Office Action for U.S. Appl. No. 13/852,648, mailed Jul. 20, 2016, 14 pages.
Notice of Allowance for U.S. Appl. No. 14/529,870, mailed Jul. 15, 2016, 8 pages.
Office Action of the Intellectual Property Office for Taiwanese Patent Application No. 104130224, mailed Jun. 15, 2016, 9 pages.
Ali, K. Ben et al., "RF SOI CMOS Technology on Commercial Trap-Rich High Resistivity SOI Wafer," 2012 IEEE International SOI Conference (SOI), Oct. 1-4, 2012, Napa, California, IEEE, 2 pages.
Anderson, D.R., "Thermal Conductivity of Polymers," Sandia Corporation, Mar. 8, 1966, pp. 677-690.
Author Unknown, "CoolPoly D5108 Thermally Conductive Polyphenylene Sulfide (PPS)," Cool Polymers, Inc., Aug. 8, 2007, 2 pages.
Author Unknown, "CoolPoly D5506 Thermally Conductive Liquid Crystalline Polymer (LCP)," Cool Polymers, Inc., Dec. 12, 2013, 2 pages.
Author Unknown, "CoolPoly D-Series—Thermally Conductive Dielectric Plastics," Cool Polymers, Retrieved Jun. 24, 2013, http://coolpolymers.com/dseries.asp, 1 page.
Author Unknown, "CoolPoly E2 Thermally Conductive Liquid Crystalline Polymer (LCP)," Cool Polymers, Inc., Aug. 8, 2007, http://www.coolpolymers.com/Files/DS/Datasheet_e2.pdf, 1 page.
Author Unknown, "CoolPoly E3605 Thermally Conductive Polyamide 4,6 (PA 4,6)," Cool Polymers, Inc., Aug. 1, 2007, 1 page, http://www.coolpolymers.com/Files/DS/Datasheet_e3605.pdf.
Author Unknown, "CoolPoly E5101 Thermally Conductive Polyphenylene Sulfide (PPS)," Cool Polymers, Inc., Aug. 27, 2007, 1 page, http://www.coolpolymers.com/Files/DS/Datasheet_e5101.pdf.
Author Unknown, "CoolPoly E5107 Thermally Conductive Polyphenylene Sulfide (PPS)," Cool Polymers, Inc., Aug. 8, 2007, 1 page, http://coolpolymers.com/Files/DS/Datasheet_e5107.pdf.
Author Unknown, "CoolPoly Selection Tool," Cool Polymers, Inc., 2006, 1 page, http://www.coolpolymers.com/select.asp?Application=Substrates+%26+Electcronic_Packaging.
Author Unknown, "CoolPoly Thermally Conductive Plastics for Dielectric Heat Plates," Cool Polymers, Inc., 2006, 2 pages, http://www.coolpolymers.com/heatplate.asp.
Author Unknown, "CoolPoly Thermally Conductive Plastics for Substrates and Electronic Packaging," Cool Polymers, Inc., 2005, 1 page.
Author Unknown, "Electrical Properties of Plastic Materials," Professional Plastics, Oct. 28, 2011, http://www.professionalplastics.com/professionalplastics/ElectricalPropertiesofPlastics.pdf, accessed Dec. 18, 2014, 4 pages.
Author Unknown, "Heat Transfer," Cool Polymers, Inc., 2006, http://www.coolpolymers.com/heattrans.html, 2 pages.
Author Unknown, "Plastics that Conduct Heat," Plastics Technology Online, Jun. 2001, Retrieved Jun. 24, 2013, http://www.ptonline.com/articles/plastics-that-conduct-heat, 4 pages.
Author Unknown, "Sapphire Substrate," from CRC Handbook of Chemistry and Physics, Date Unknown, 1 page.
Author Unknown, "Thermal Properties of Plastic Materials," Professional Plastics, Aug. 21, 2010, http://www.professionalplastics.com/professionalplastics/ThermalPropertiesofPlasticMaterials.pdf, accessed Dec. 18, 2014, 4 pages.
Author Unknown, "Thermal Properties of Solids," PowerPoint Presentation, No Date, 28 slides, http://www.phys.huji.ac.il/Phys_Hug/Lectures/77602/PHONONS_2_thermal.pdf.
Author Unknown, "Thermal Resistance & Thermal Conductance," C-Therm Technologies Ltd., accessed Sep. 19, 2013, 4 pages, http://www.ctherm.com/products/tci_thermal_conductivity/helpful_links_tools/thermal_resistance_thermal_conductance/.
Beck, D., et al., "CMOS on FZ-High Resistivity Substrate for Monolithic Integration of SiGe-RF-Circuitry and Readout Electronics," IEEE Transactions on Electron Devices, vol. 44, No. 7, Jul. 1997, pp. 1091-1101.
Botula, A., et al., "A Thin-Film SOI 180nm CMOS RF Switch Technology," IEEE Topical Meeting on Silicon Monolithic Integrated Circuits in RF Systems, (SiRF '09), Jan. 2009, pp. 1-4.
Carroll, M., et al., "High-Resistivity SOI CMOS Cellular Antenna Switches," Annual IEEE Compound Semiconductor Integrated Circuit Symposium, (CISC 2009), Oct. 2009, pp. 1-4.
Colinge, J.P., et al., "A Low-Voltage, Low-Power Microwave SOI MOSFET," Proceedings of 1996 IEEE International SOI Conference, Oct. 1996, pp. 128-129.
Costa, J. et al., "Silicon RFCMOS SOI Technology with Above-IC MEMS Integration for Front End Wireless Applications," Bipolar/BiCMOS Circuits and Technology Meeting, 2008, BCTM 2008, IEEE, pp. 204-207.
Costa, J., "RFCMOS SOI Technology for 4G Reconfigurable RF Solutions," Session WEC1-2, Proceedings of the 2013 IEEE International Microwave Symposium, 4 pages.
Esfeh, Babak Kazemi et al., "RF Non-Linearities from Si-Based Substrates," 2014 International Workshop on Integrated Nonlinear Microwave and Millimetre-wave Circuits (INMMiC), Apr. 2-4, 2014, IEEE, 3 pages.
Finne, R. M. et al., "A Water-Amine-Complexing Agent System for Etching Silicon," Journal of the Electrochemical Society, vol. 114, No. 9, Sep. 1967, pp. 965-970.
Gamble, H. S. et al., "Low-Loss CPW Lines on Surface Stabilized High-Resistivity Silicon," IEEE Microwave and Guided Wave Letters, vol. 9, No. 10, Oct. 1999, pp. 395-397.
Huang, Xingyi, et al., "A Review of Dielectric Polymer Composites with High Thermal Conductivity," IEEE Electrical Insulation Magazine, vol. 27, No. 4, Jul./Aug. 2011, pp. 8-16.
Joshi, V. et al., "MEMS Solutions in RF Applications," 2013 IEEE SOI-3D-Subthreshold Microelectronics Technology Unified Conference (S3S), Oct. 2013, IEEE, 2 pages.
Jung, Boo Yang, et al., "Study of FCMBGA with Low CTE Core Substrate," 2009 Electronic Components and Technology Conference, May 2009, pp. 301-304.
Kerr, D.C., et al., "Identification of RF Harmonic Distortion on Si Substrates and Its Reduction Using a Trap-Rich Layer," IEEE Topical Meeting on Silicon Monolithic Integrated Circuits in RF Systems, (SiRF 2008), Jan. 2008, pp. 151-154.
Lederer, D., et al., "New Substrate Passivation Method Dedicated to HR SOI Wafer Fabrication with Increased Substrate Resistivity," IEEE Electron Device Letters, vol. 26, No. 11, Nov. 2005, pp. 805-807.
Lederer, Dimitri et al., "Substrate loss mechanisms for microstrip and CPW transmission lines on lossy silicon wafers," Solid-State Electronics, vol. 47, No. 11, Nov. 2003, pp. 1927-1936.
Lee, Kwang Hong et al., "Integration of III-V materials and Si-CMOS through double layer transfer process," Japanese Journal of Applied Physics, vol. 54, Jan. 2015, pp. 030209-1 to 030209-5.
Lee, Tzung-Yin, et al., "Modeling of SOI FET for RF Switch Applications," IEEE Radio Frequency Integrated Circuits Symposium, May 23-25, 2010, Anaheim, CA, IEEE, pp. 479-482.
Lu, J.Q., et al., "Evaluation Procedures for Wafer Bonding and Thinning of Interconnect Test Structures for 3D ICs," Proceedings of the IEEE 2003 International Interconnect Technology Conference, Jun. 2-4, 2003, pp. 74-76.
Mamunya, YE.P., et al., "Electrical and Thermal Conductivity of Polymers Filled with Metal Powders," European Polymer Journal, vol. 38, 2002, pp. 1887-1897.
Mansour, Raafat R., "RF MEMS-CMOS Device Integration," IEEE Microwave Magazine, vol. 14, No. 1, Jan. 2013, pp. 39-56.

(56) References Cited

OTHER PUBLICATIONS

Mazuré C. et al "Advanced SOI Substrate Manufacturing," 2004 IEEE International Conference on Integrated circuit Design and Technology, 2004, IEEE, pp. 105-111.
Morris, Art, "Monolithic Integration of RF-MEMS within CMOS," 2015 International Symposium on VLSI Technology, Systems and Application (VLSI-TSA), Apr. 27-29, 2015, IEEE, 2 pages.
Niklaus, F., et al., "Adhesive Wafer Bonding," Journal of Applied Physics, vol. 99, No. 3, 031101 (2006), 28 pages.
Parthasarathy, S., et al., "RF SOI Switch FET Design and Modeling Tradeoffs for GSM Applications," 2010 23rd International Conference on VLSI Design, (VLSID '10), Jan. 2010, pp. 194-199.
Raskin, Jean-Pierre et al., "Substrate Crosstalk Reduction Using SOI Technology," IEEE Transactions on Electron Devices, vol. 44, No. 12, Dec. 1997, pp. 2252-2261.
Raskin, J.P., et al., "Coupling Effects in High-Resistivity SIMOX Substrates for VHF and Microwave Applications," Proceedings of 1995 IEEE International SOI Conference, Oct. 1995, pp. 62-63.
Bong, B., et al., "Surface-Passivated High-Resistivity Silicon Substrates for RFICs," IEEE Electron Device Letters, vol. 25, No. 4, Apr. 2004, pp. 176-178.
Tombak, A., et al., "High-Efficiency Cellular Power Amplifiers Based on a Modified LDMOS Process on Bulk Silicon and Silicon-On-Insulator Substrates with Integrated Power Management Circuitry," IEEE Transactions on Microwave Theory and Techniques, vol. 60, No. 6, Jun. 2012, pp. 1862-1869.
Yamanaka, A., et al., "Thermal Conductivity of High-Strength Polyetheylene Fiber and Applications for Cryogenic Use," International Scholarly Research Network, ISRN Materials Science, vol. 2011, Article ID 718761, May 25, 2011, 10 pages.
Non-Final Office Action for U.S. Appl. No. 13/852,648, mailed Jul. 18, 2013, 20 pages.
Final Office Action for U.S. Appl. No. 13/852,648, mailed Nov. 26, 2013, 21 pages.
International Search Report and Written Opinion for PCT/US2016/045809, mailed Oct. 7, 2016, 11 pages.
Final Office Action for U.S. Appl. No. 14/715,830, mailed Sep. 6, 2016, 13 pages.
Advisory Action for U.S. Appl. No. 14/715,830, mailed Oct. 31, 2016, 6 pages.
Non-Final Office Action for U.S. Appl. No. 14/851,652, mailed Oct. 7, 2016, 10 pages.
Non-Final Office Action for U.S. Appl. No. 15/173,037, mailed Jan. 10, 2017, 8 pages.
Advisory Action for U.S. Appl. No. 14/885,202, mailed Nov. 29, 2016, 3 pages.
Notice of Allowance for U.S. Appl. No. 14/885,202, mailed Jan. 27, 2017, 7 pages.

\* cited by examiner

ENCAPSULATED DIES WITH ENHANCED THERMAL PERFORMANCE

RELATED APPLICATIONS

This application claims the benefit of U.S. provisional patent application No. 62/138,177, filed Mar. 25, 2015, the disclosure of which is incorporated herein by reference in its entirety.

FIELD OF THE DISCLOSURE

The present disclosure relates to a packaging process, and more particularly to a packaging process to enhance thermal performance of encapsulated flip chip dies.

BACKGROUND

With the current popularity of portable communication devices and developed semiconductor fabrication technology, high speed and high performance transistors are more densely integrated on semiconductor dies. Consequently, the amount of heat generated by the semiconductor dies will increase significantly due to the large number of transistors integrated on the semiconductor dies, the large amount of power passing through the transistors, and the high operation speed of the transistors. Accordingly, it is desirable to package the semiconductor dies in a configuration for better heat dissipation.

Flip chip assembly technology is widely utilized in semiconductor packaging due to its preferable solder interconnection between flip chip dies and laminate, which eliminates the space needed for wire bonding and die surface area of a package and essentially reduces the overall size of the package. In addition, the elimination of wire connections and implementation of a shorter electrical path from the flip chip die to the laminate reduces undesired inductance and capacitance.

In flip-chip assembly, mold compounds, formulated from epoxy resins containing silica particulates, are used to encapsulate and underfill flip chip dies to protect the dies against damage from the outside environment. Some of the mold compounds can be used as a barrier withstanding chemistries such as potassium hydroxide (KOH), sodium hydroxide (NaOH) and acetylcholine (ACH) without breakdown; while some of the mold compounds having good thermal conductive features can be used for heat dissipation of dies.

To accommodate the increased heat generation of high performance dies and to utilize the advantages of flip chip assembly, it is therefore an object of the present disclosure to provide a method to package flip chip dies in a configuration for better heat dissipation. In addition, there is also a need to enhance the thermal performance of encapsulated flip chip dies without increasing the package size.

SUMMARY

The present disclosure relates to enhancing the thermal performance of encapsulated flip chip dies. According to an exemplary process, a plurality of flip chip dies are attached on a top surface of a carrier, and a first mold compound is applied over the top surface of the carrier to encapsulate the plurality of flip chip dies. The first mold compound is thinned down to expose a substrate of each flip chip die and a wet/dry etchant material is used to etch away substantially the entire substrate of each flip chip die to provide an etched flip chip die that has an exposed surface at the bottom of a cavity. Next, a second mold compound is applied to substantially fill each cavity and directly contact the exposed surface of the etched flip chip die. The second mold compound is a high thermal conductivity mold compound, which improves thermal performance. The top surface of the second mold compound is then planarized. Finally, the encapsulated etched flip chip dies can be marked, singulated, and tested as a module.

Those skilled in the art will appreciate the scope of the disclosure and realize additional aspects thereof after reading the following detailed description in association with the accompanying drawings.

BRIEF DESCRIPTION OF THE DRAWINGS

The accompanying drawings incorporated in and forming a part of this specification illustrate several aspects of the disclosure, and together with the description serve to explain the principles of the disclosure.

DETAILED DESCRIPTION

Figure 1:
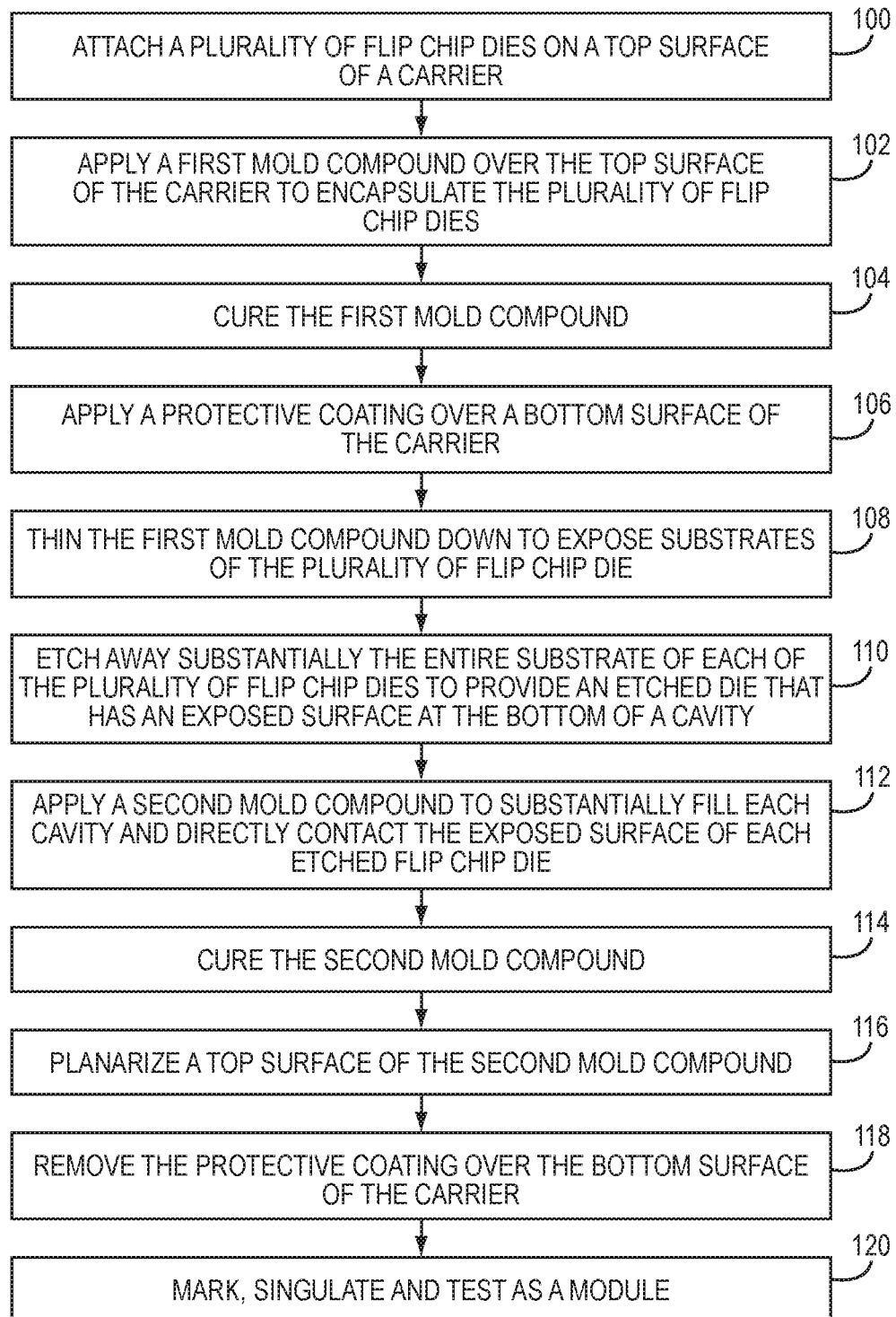
FIG. 1 provides a flow diagram that illustrates an exemplary etching and filling process according to one embodiment of the present disclosure.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Figure 2:
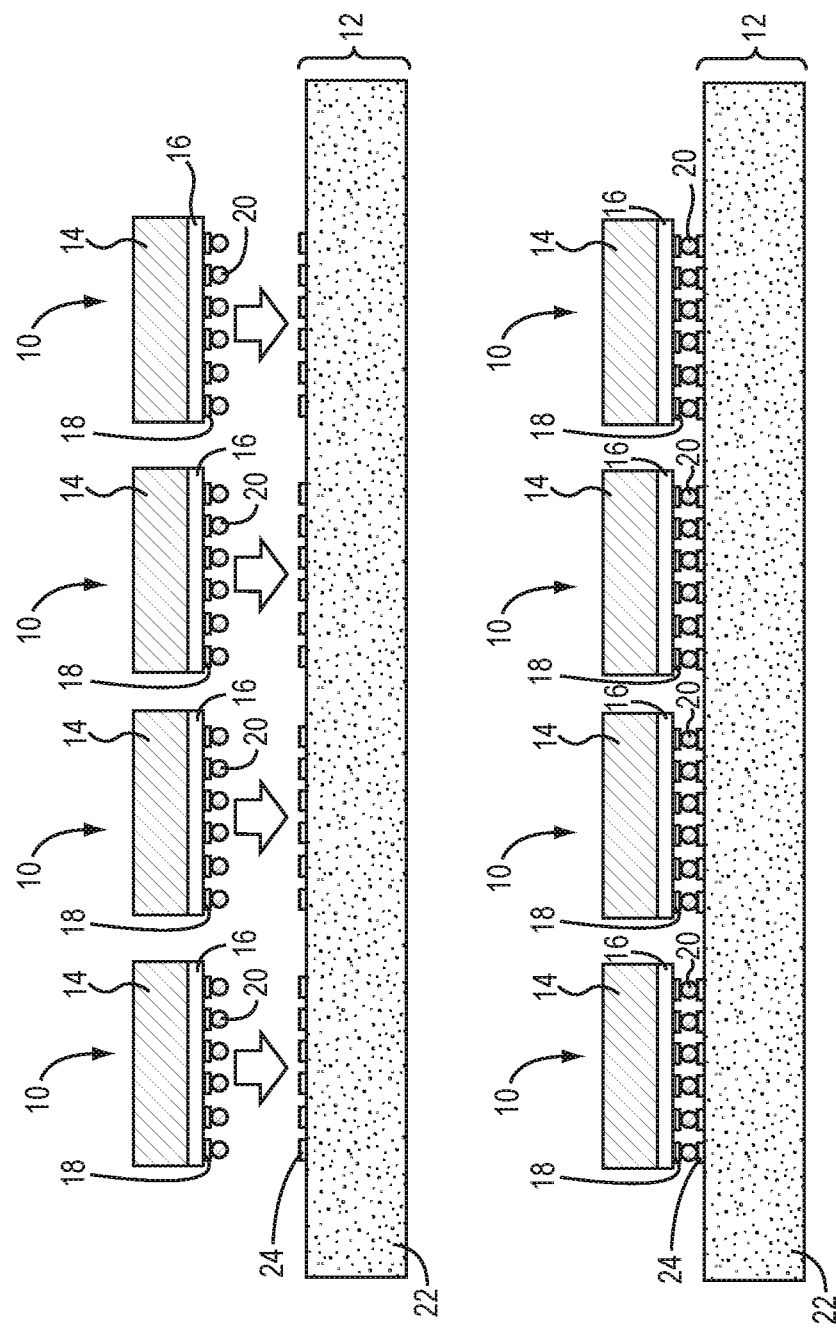
FIGS. 2-8 illustrate the steps associated with the etching and filling process provided in FIG. 1.

The present disclosure relates to a method to enhance the thermal performance of encapsulated flip chip dies. FIG. 1 provides a flow diagram that illustrates an exemplary etching and filling process according to one embodiment of the present disclosure. FIGS. 2-8 illustrate the steps associated with the etching and filling process provided in FIG. 1. Although various types of materials may be used for the substrate, the following examples incorporate silicon as the preferred material. Initially, a plurality of flip chip dies 10 are attached on a top surface of a carrier 12 as depicted in FIG. 2 (Step 100). The carrier of the described embodiment is formed from a laminate, but may also be formed from a wafer level fan out (WLFO) carrier, a lead frame, a ceramic carrier, or the like. For the purpose of this illustration, each flip chip die 10 includes a substrate 14 with approximately 150-500 µm thickness, a device layer 16 with approximately 4-7 µm thickness, layer contacts 18 located on a bottom surface of the device layer 16, and solder interconnections 20 provided on each of the layer contacts 18. The device layer 16 may be formed from silicon dioxide, gallium arsenide, gallium nitride, silicon germanium, and the like and includes various devices, such as diodes, transistors, mechanical switches, resonators, and the like. The carrier 12 includes a carrier body 22, carrier contacts 24 on a top surface of the carrier 12 and input/output (I/O) pads (not shown) on a bottom surface of the carrier 12. The I/O pads on the bottom surface of the carrier 12 may be formed by a ball grid array (BGA) or land grid array (LGA) method and selectively connect to the carrier contacts 24 through any number of vias (not shown). The solder interconnections 20 of the flip chip dies 10 are used to electrically and physically connect to the carrier contacts 24 of the carrier 12. As such, the backside of the substrate 14 of the plurality of flip chip dies 10 will generally be the tallest component after the attaching process. The height between the device layer 16 and the carrier body 22 often varies from 15-200 µm.

Figure 3:
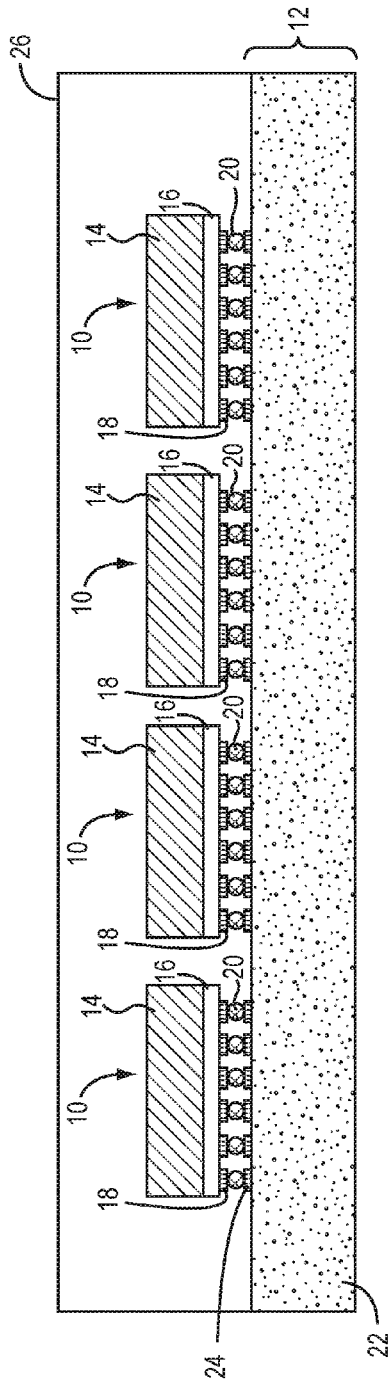

A first mold compound 26 is then applied over the top surface of the carrier 12 such that the flip chip dies 10 are encapsulated by the first mold compound 26 as illustrated in FIG. 3 (Step 102). The first mold compound 26 may be applied by various procedures, such as sheet molding, overmolding, compression molding, transfer molding, dam fill encapsulation and screen print encapsulation. The first mold compound 26 is an organic epoxy resin system or the like, such as Hitachi Chemical Electronic Materials GE-100LFC, which can be used as an etchant barrier to protect the flip chip dies 10 against etching chemistries such as KOH, NaOH and ACH. A curing process (Step 104) is then used to harden the first mold compound.

Figure 4:
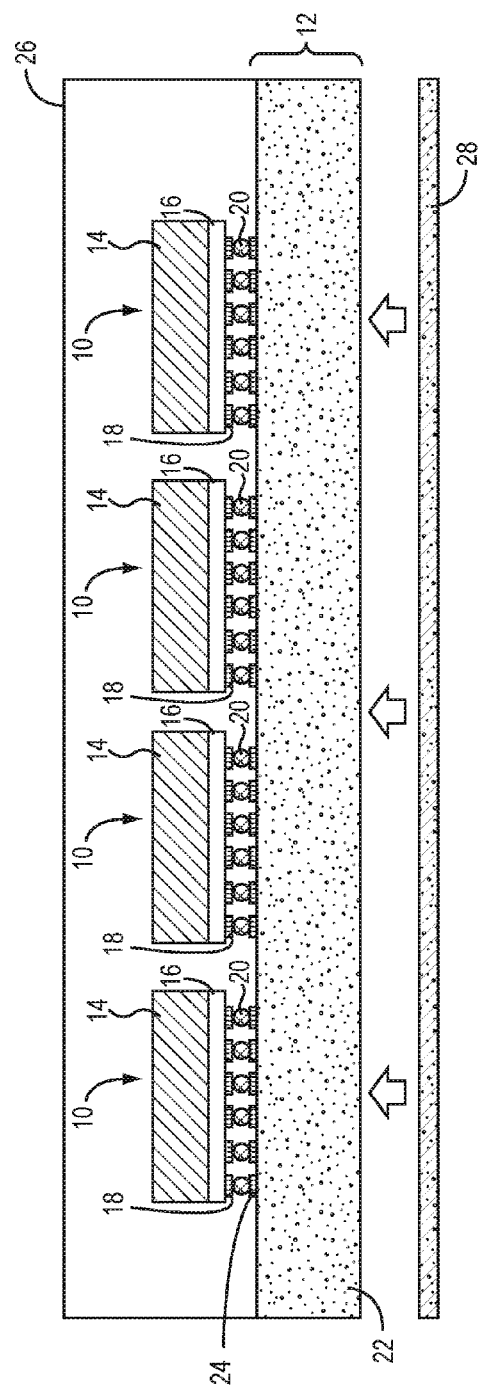
Figure 5:
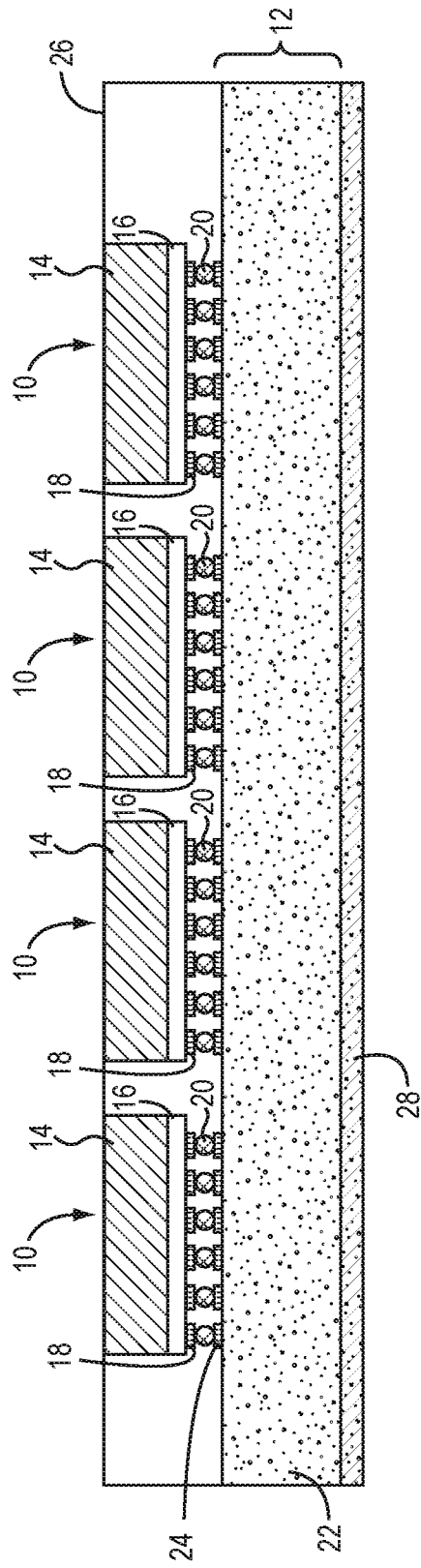
Figure 6:
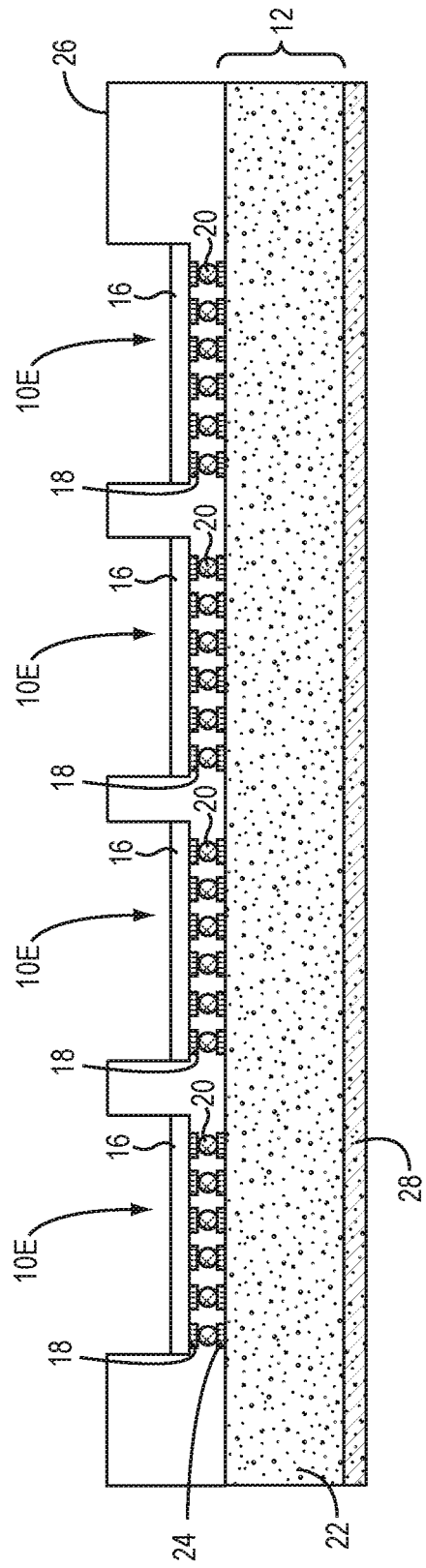

With reference to FIGS. 4 through 6, a process for etching away substantially the entire substrate 14 of each encapsulated flip chip die 10 is provided according to one embodiment of the present disclosure. The process begins by forming a protective coating 28 over the bottom surface of the carrier 12, as shown in FIG. 4 (Step 106). The purpose of the protective coating 28 is to prevent potential damage to the I/O pads (not shown) on the bottom surface of the carrier 12 in subsequent processing steps. The protective coating 28 may be a chemical resistant tape or liquid protective coating, which can withstand etching chemistries such as KOH, NaOH and ACH without breakdown. Alternately, a rigid carrier can be sealed on the bottom surface of the carrier 12 as a protective coating 28 to prevent the I/O pads (not shown) on the bottom surface of the carrier 12 from contacting the destructive etchant materials in later etching processes.

The next process step is to thin the first mold compound 26 down to expose the back side of the flip chip dies 10, wherein the only exposed component of the flip chip dies 10 will be the substrate 14, as shown in FIG. 5 (Step 108). The thinning procedure may be done with a mechanical process. An alternate process step would be to leave the back side of the flip chip dies 10 always exposed during the molding process with the first mold compound 26.

Next, a wet/dry etchant chemistry, which may be KOH, ACH, NaOH or the like, is used to etch away substantially the entire substrate 14 of each flip chip die 10 to provide an etched flip chip die 10E that has an exposed surface at the bottom of a cavity, as shown in FIG. 6 (Step 110). Herein, etching away substantially the entire substrate 14 refers to removal of at least 95% of the entire substrate 14, and perhaps a portion of the device layer 16. As such, in some applications, there is a thin layer of the substrate 14 left at the bottom of the cavity of each etched flip chip die 10E, which covers the device layer 16, to protect the devices located on the device layer 16. For other cases, the substrate 14 is etched away completely and the device layer 16 is exposed at the bottom of the cavity of each etched flip chip die 10E.

Figure 7:
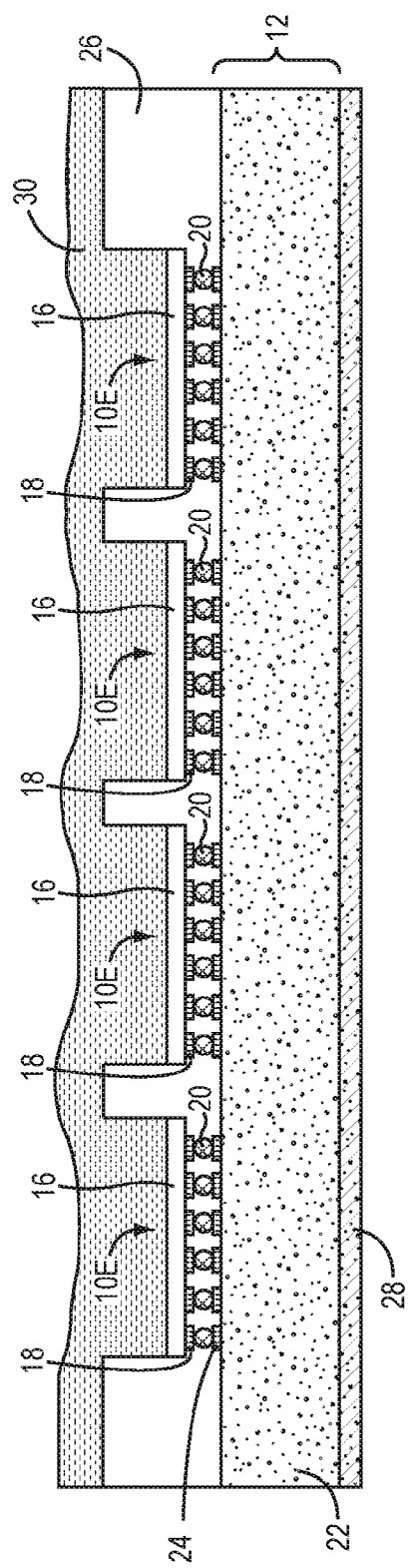
Figure 8:
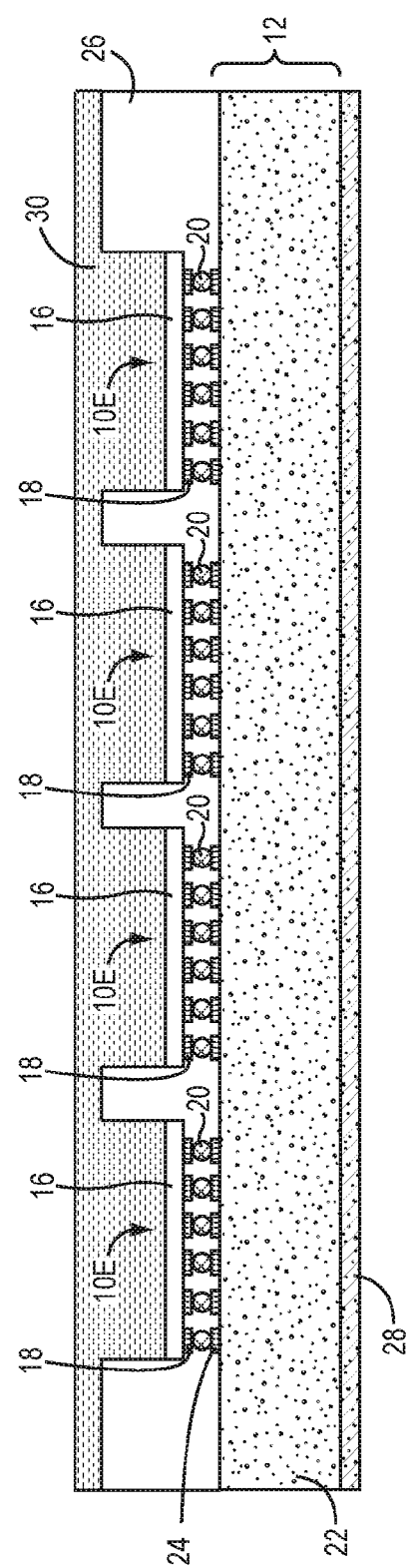
Figure 9:
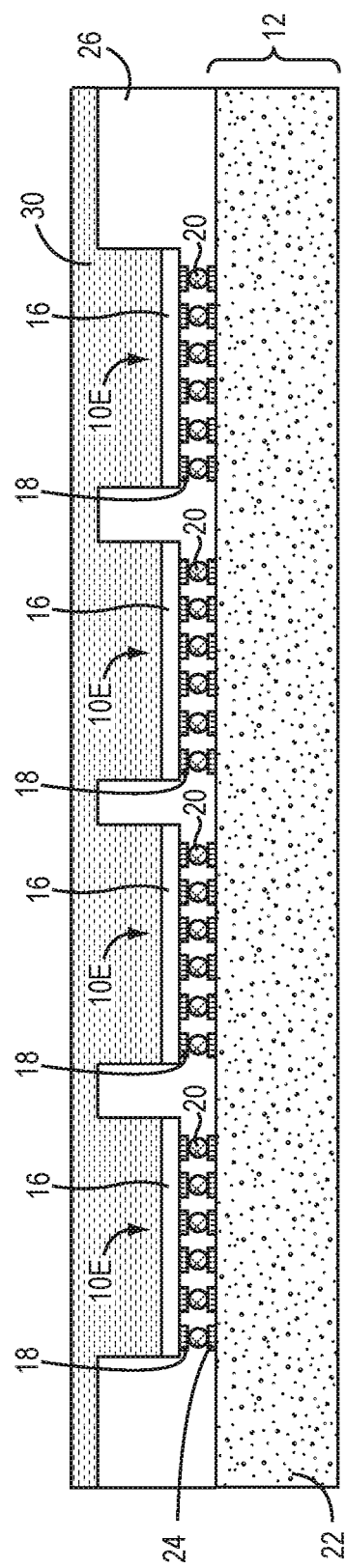
FIG. 9 illustrates an exemplary application of the present disclosure.

With reference to FIGS. 7 through 9, a process for filling the remaining cavity of each etched flip chip die 10E is provided according to one embodiment of the present disclosure. After the etching step is done, a second mold compound 30 is applied to substantially fill the remaining cavity of each etched flip chip die 10E, as illustrated in FIG. 7 (Step 112). The second mold compound 30 may be applied by various procedures, such as sheet molding, overmolding, compression molding, transfer molding, dam fill encapsulation, and screen print encapsulation. The second mold compound 30 is a high thermal conductivity mold compound. Compared to the normal mold compound having 1 w/m·k thermal conductivity, a high thermal conductivity mold compound has 2.5 w/m·k-10 w/m·k or greater thermal conductivity, such as Hitachi Chemical Electronic Materials GE-506HT. The higher the thermal conductivity, the better the heat dissipation performance of the encapsulated etched flip chip dies 10E. Additionally, the second mold compound 30 directly contacts the exposed surface of each etched flip chip die 10E at the bottom of each cavity. If the substrate 14 is removed completely in the etching step (Step 110), the second mold compound 30 directly contacts the device layer 16. If there is a thin layer of substrate 14 left in the etching step (Step 110), the second mold compound 30 directly contacts the thin layer of substrate 14. Notably, the first mold compound 26 could be formed from the same material as the second mold compound 30. However, unlike the second mold compound 30, the first mold compound 26 does not have a thermal conductivity requirement in higher performing embodiments. A curing process (Step 114) is then provided to harden the second mold compound. The normal curing temperature is 175° F. and could be higher or lower depending on which material is used as the second mold compound 30.

The top surface of the second mold compound 30 is then planarized to ensure each encapsulated etched flip chip die 10E has a flat top surface as shown in FIG. 8 (Step 116). A package grinding process may be used for planarization. Next, the protective coating 28 applied over the bottom surface of the carrier 12 is removed as illustrated in FIG. 9 (Step 118). Lastly, the product could be marked, singulated and tested as a module (Step 120).

Those skilled in the art will recognize improvements and modifications to the embodiments of the present disclosure. All such improvements and modifications are considered within the scope of the concepts disclosed herein and the claims that follow.

What is claimed is:

1. A method comprising:
attaching a plurality of flip chip dies on a top surface of a carrier;
applying a first mold compound over the top surface of the carrier to encapsulate the plurality of flip chip dies;
thinning the first mold compound down to expose substrates of the plurality of flip chip dies;
etching away substantially the entire substrate of each of the plurality of flip chip dies with an etchant to provide an etched flip chip die that has an exposed surface at the bottom of a cavity; and
applying a second mold compound to substantially fill each cavity and directly contact the exposed surface of each etched flip chip die.

2. The method of claim 1 wherein the carrier is one of a group consisting of a laminate, a wafer level fan out (WLFO) carrier, a lead frame, and a ceramic carrier.

3. The method of claim 1 wherein the first mold compound is an organic epoxy resin system.

4. The method of claim 1 wherein a thickness of the substrate of each of the plurality of flip chip dies is 150-500 μm.

5. The method of claim 1 wherein the first mold compound is resistant to the etchant.

6. The method of claim 1 wherein the exposed surface at the bottom of the cavity is a top surface of a device layer of each etched flip chip die.

7. The method of claim 6 wherein the device layer includes at least one of a group consisting of diodes, transistors, mechanical switches, and resonators.

8. The method of claim 6 wherein a thickness of the device layer is 4-7 μm.

9. The method of claim 1 wherein the second mold compound has high thermal conductivity between 2.5 w/m·k and 10 w/m·k.

10. The method of claim 1 wherein the first mold compound is formed from a first material, and the second mold compound is formed from the first material.

11. The method of claim 1 wherein applying the first mold compound over the top surface of the carrier to encapsulate the plurality of flip chip dies is provided by sheet molding.

12. The method of claim 1 wherein applying the first mold compound over the top surface of the carrier to encapsulate the plurality of flip chip dies is provided by overmolding.

13. The method of claim 1 wherein applying the first mold compound over the top surface of the carrier to encapsulate the plurality of flip chip dies is provided by compression molding.

14. The method of claim 1 wherein applying the second mold compound to substantially fill each cavity is provided by sheet molding.

15. The method of claim 1 wherein applying the second mold compound to substantially fill each cavity is provided by overmolding.

16. The method of claim 1 wherein applying the second mold compound to substantially fill each cavity is provided by compression molding.

17. The method of claim 1 further comprising applying a protective coating over a bottom surface of the carrier.

18. The method of claim 17 further comprising removing the protective coating over the bottom surface of the carrier.

19. The method of claim 17 wherein the protective coating is one of a group consisting of a chemical resistant tape, a liquid protective coating, and a rigid protective carrier.

20. The method of claim 1 further comprising planarizing a top surface of the second mold compound.

21. The method of claim 1 wherein the first mold compound and the second mold compound are formed from different materials.

22. The method of claim 21 wherein the second mold compound has a thermal conductivity between 2.5 w/m·k and 10 w/m·k.

23. The method of claim 21 wherein the second mold compound has a thermal conductivity greater than 2.5 w/m·k.

24. The method of claim 22 wherein the second mold compound has a thermal conductivity greater than 10 w/m·k.

25. The method of claim 21 wherein the first mold compound is resistant to the etchant.

26. The method of claim 1 wherein the second mold compound has a thermal conductivity greater than 2.5 w/m·k.

27. The method of claim 1 wherein the second mold compound has a thermal conductivity greater than 10 w/m·k.

* * * * *